(12) United States Patent
Oguz et al.

(10) Patent No.: US 10,580,970 B2
(45) Date of Patent: Mar. 3, 2020

(54) PSTTM DEVICE WITH FREE MAGNETIC LAYERS COUPLED THROUGH A METAL LAYER HAVING HIGH TEMPERATURE STABILITY

(71) Applicant: Intel Corporation, Santa Clara, CA (US)

(72) Inventors: Kaan Oguz, Beaverton, OR (US); Kevin P. O'Brien, Portland, OR (US); Christopher J. Wiegand, Portland, OR (US); Tofizur Rahman, Portland, OR (US); Brian S. Doyle, Portland, OR (US); Mark L. Doczy, Portland, OR (US); Oleg Golonzka, Beaverton, OR (US); Tahir Ghani, Portland, OR (US); Justin S. Brockman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,444

(22) PCT Filed: Sep. 25, 2015

(86) PCT No.: PCT/US2015/052292
§ 371 (c)(1),
(2) Date: Feb. 26, 2018

(87) PCT Pub. No.: WO2017/052606
PCT Pub. Date: Mar. 30, 2017

(65) Prior Publication Data
US 2018/0248114 A1    Aug. 30, 2018

(51) Int. Cl.
*H01L 43/08*   (2006.01)
*H01L 43/10*   (2006.01)
(Continued)

(52) U.S. Cl.
CPC ............ *H01L 43/08* (2013.01); *G11C 11/161* (2013.01); *H01F 10/3254* (2013.01);
(Continued)

(58) Field of Classification Search
CPC ..... H01L 43/08; H01L 27/222; H01L 27/228; H01F 10/3286; G11C 11/161
See application file for complete search history.

(56) References Cited

U.S. PATENT DOCUMENTS 6,965,138 B2   11/2005   Nakajima et al.
7,098,495 B2   8/2006   Sun et al.
(Continued)

FOREIGN PATENT DOCUMENTS

EP   1727149      11/2006
JP   2005044848   2/2005
(Continued)

OTHER PUBLICATIONS

International Search Report and Written Opinion for International Patent Application No. PCT/US2015/052292, dated Jun. 24, 2016.
(Continued)

*Primary Examiner* — Mark V Prenty
(74) *Attorney, Agent, or Firm* — Green, Howard & Mughal LLP

(57) ABSTRACT

MTJ material stacks, pSTTM devices employing such stacks, and computing platforms employing such STTM devices. In some embodiments, perpendicular MTJ material stacks with free magnetic layers are magnetically coupled through a metal material layer for improved stability and low damping. In some advantageous embodiments, layers of a free magnetic material stack are magnetically coupled through a coupling layer of a metal comprising at least molybdenum (Mo). The Mo may be in pure form or alloyed with other constituents.

16 Claims, 10 Drawing Sheets

(51) Int. Cl.
H01L 43/12 (2006.01)
H01F 10/32 (2006.01)
H01F 41/30 (2006.01)
G11C 11/16 (2006.01)
H01L 27/22 (2006.01)
H01L 43/02 (2006.01)

(52) U.S. Cl.
CPC ..... H01F 10/3272 (2013.01); H01F 10/3286 (2013.01); H01F 41/307 (2013.01); H01L 27/228 (2013.01); H01L 43/02 (2013.01); H01L 43/10 (2013.01); H01L 43/12 (2013.01)

(56) References Cited

U.S. PATENT DOCUMENTS

| | | | |
|---|---|---|---|
| 7,538,402 | B2 | 5/2009 | Fukumoto |
| 8,159,870 | B2 | 4/2012 | Xia |
| 8,476,722 | B2 | 7/2013 | Lee |
| 2004/0211963 | A1 | 10/2004 | Garni et al. |
| 2005/0247964 | A1 | 11/2005 | Pietambaram et al. |
| 2007/0183187 | A1 | 8/2007 | Guo |
| 2012/0126905 | A1 | 5/2012 | Zhang et al. |
| 2012/0163070 | A1 | 6/2012 | Nagase et al. |
| 2013/0001506 | A1 | 1/2013 | Sato |
| 2013/0001652 | A1 | 1/2013 | Yoshikawa et al. |
| 2013/0099780 | A1 | 4/2013 | Ma et al. |
| 2014/0021426 | A1 | 1/2014 | Lee et al. |
| 2014/0084398 | A1 | 3/2014 | Oguz et al. |
| 2014/0084938 | A1 | 3/2014 | Lai et al. |
| 2014/0145792 | A1 | 5/2014 | Wang et al. |
| 2014/0269035 | A1 | 9/2014 | Manipatruni et al. |
| 2014/0306302 | A1 | 10/2014 | Guenole et al. |
| 2015/0035095 | A1 | 2/2015 | Kim et al. |
| 2015/0061020 | A1 | 3/2015 | Yokoyama et al. |
| 2015/0171316 | A1 | 6/2015 | Park et al. |
| 2018/0240970 | A1 | 8/2018 | Oguz et al. |
| 2018/0248114 | A1* | 8/2018 | Oguz ..................... H01L 43/08 |

FOREIGN PATENT DOCUMENTS

| | | |
|---|---|---|
| JP | 2008507854 | 3/2008 |
| JP | 2011519476 | 7/2011 |
| KR | 1020110117515 | 10/2011 |

OTHER PUBLICATIONS

International Search Report and Written Opinion for International Patent Application No. PCT/US2015/052383, dated Jun. 23, 2016.
International Search Report and Written Opinion for International Patent Application No. PCT/US2015/052430, dated Jun. 24, 2016.
International Preliminary Report for Patentability for International Patent Application No. PCT/US15/52292, dated Apr. 5, 2018.
Extended European Search Report dated Apr. 23, 2019 for EP Patent Application No. 15904941.0.
1st Office Action & Search Report dated Nov. 12, 2019 for Taiwan Patent Application No. 105126394. No translation.

* cited by examiner

PSTTM DEVICE WITH FREE MAGNETIC LAYERS COUPLED THROUGH A METAL LAYER HAVING HIGH TEMPERATURE STABILITY

CLAIM OF PRIORITY

This Application is a National Stage Entry of, and claims priority to, PCT Application No. PCT/US15/52292, filed on 25 Sep. 2015 and titled "PSTTM DEVICE WITH FREE MAGNETIC LAYERS COUPLED THROUGH A METAL LAYER HAVING HIGH TEMPERATURE STABILITY", which is incorporated by reference in its entirety for all purposes.

CROSS-REFERENCE TO RELATED APPLICATIONS

This application contains subject matter related to PCT Application US15/52383, titled "PSTTM DEVICE WITH MULTI-LAYERED FILTER STACK" filed on Sep. 25, 2015, and PCT Application US15/52430, titled "PSTTM DEVICE WITH BOTTOM ELECTRODE INTERFACE MATERIAL" filed on Sep. 25, 2015.

BACKGROUND

STTM devices are non-volatile memory devices that utilize a phenomenon known as tunneling magnetoresistance (TMR). For a structure including two ferromagnetic layers separated by a thin insulating tunnel layer, it is more likely that electrons will tunnel through the tunnel layer when magnetizations of the two magnetic layers are in a parallel orientation than if they are not (non-parallel or antiparallel orientation). As such, a magnetic tunneling junction (MTJ), typically comprising a fixed magnetic layer and a free magnetic layer separated by a tunneling barrier layer, can be switched between two states of electrical resistance, one state having a low resistance and one state with a high resistance. The greater the differential in resistance, the higher the TMR ratio: $(R_{AP}-R_p)/R_p*100\%$ where $R_p$ and $R_{AP}$ are resistances for parallel and antiparallel alignment of the magnetizations, respectively. The higher the TMR ratio, the more readily a bit can be reliably stored in association with the MTJ resistive state. The TMR ratio of a given MTJ is therefore an important performance metric of an STTM.

For an STTM device, current-induced magnetization switching may be used to set the bit states. Polarization states of one ferromagnetic layer can be switched relative to a fixed polarization of the second ferromagnetic layer via the spin transfer torque phenomenon, enabling states of the MTJ to be set by application of current. Angular momentum (spin) of the electrons may be polarized through one or more structures and techniques (e.g., direct current, spin-hall effect, etc.). These spin-polarized electrons can transfer their spin angular momentum to the magnetization of the free layer and cause it to precess. As such, the magnetization of the free magnetic layer can be switched by a pulse of current (e.g., in about 1-10 nanoseconds) exceeding a certain critical value, while magnetization of the fixed magnetic layer remains unchanged as long as the current pulse is below some higher threshold associated with the fixed layer architecture.

MTJs with magnetic electrodes having a perpendicular (out of plane of substrate) magnetic easy axis have a potential for realizing higher density memory than in-plane variants. Generally, perpendicular magnetic anisotropy (PMA) can be achieved in the free magnetic layer through interfacial perpendicular anisotropy established by an adjacent layer, such as magnesium oxide (MgO), when the free magnetic layer is sufficiently thin. A thin free magnetic layer however is associated with greater instability, which can significantly shorten the non-volatile lifetime of a memory element. Stability is one of the most important issues facing the scaling of STTM based devices and memory arrays fabricated there from.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
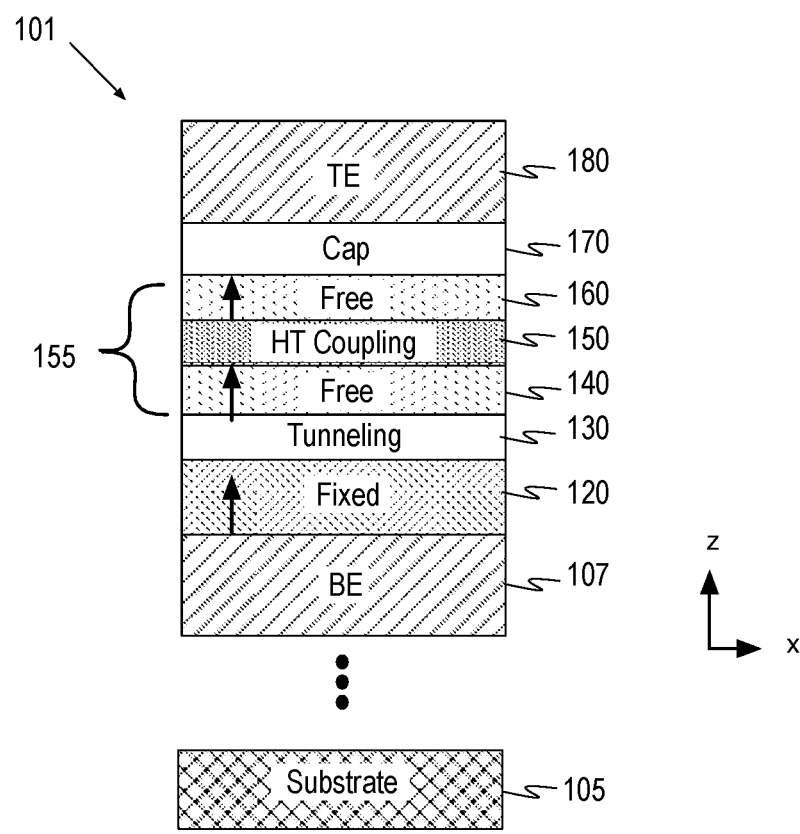
FIG. 1 is a cross-sectional view of a material layer stack for a pSTTM device, in accordance with some embodiments of the present invention.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are MTJ material stacks, STTM devices employing such material stacks, and computing platforms employing such STTM devices. In some embodiments, perpendicular MTJ material stacks include free magnetic layers magnetically coupled through a metal material layer for improved stability and low damping. Applications for embodiments described herein include embedded memory, embedded non-volatile memory (NVM), magnetic random access memory (MRAM), and non-embedded or stand-alone memories.

Thermal stability Δ is one of the most important issues facing scaling of STTM based devices and memory arrays fabricated there from. Greater thermal stability is associated with longer memory element non-volatile lifetimes. As scaling continues, it becomes more difficult to maintain sufficient stability. Thermal stability is defined as the energy barrier E between two magnetic states (e.g., (1, 0), (parallel, anti-parallel)). Stability is equal to the product of magnetic anisotropy $k_{\mathit{eff}}$ of the free magnetic material and volume of free magnetic material (thickness t multiplied by material stack area A) divided by thermal energy ($k_B$T):

$$\Delta = \frac{K_{\mathit{eff}} tA}{k_B T}. \tag{1}$$

Generally, a stability value of at least 60 $k_B$T is considered a suitable for most applications. However, it is clear that scaling of a memory cell area reduces stability and the 60 $k_B$T target becomes harder to achieve. Magnetic anisotropy is further a function of saturation magnetization $M_s$ and effective anisotropy field $H_{k,\mathit{eff}}$ such that thermal stability may be improved through an increase in anisotropy field. Perpendicular magnetic anisotropy (PMA) in the free magnetic layer can achieve greater $H_{k,\mathit{eff}}$ in the presence of interfacial perpendicular anisotropy established by an adjacent layer, such as magnesium oxide (MgO), when the free magnetic layer is sufficiently thin.

Damping relates to a magnetic friction that a spin's magnetization experiences as the spin switches from one state to another. Greater damping means that a larger critical write current $J_c$ is needed to switch the magnetization of the free layer from one state to another. Critical current $J_c$ is proportional to a damping constant α multiplied by a ratio of stability over spin transfer efficiency (~TMR). Damping increases however as free magnetic layer thickness decreases due to spin pumping effect. Often then, increases in anisotropy also increase the critical current density linearly, making it difficult to achieve higher stability without a concomitant increase in damping.

In some embodiments, the stability of an STTM cell is enhanced along with providing reduced damping through incorporation of a plurality of free magnetic layers within the stack that are coupled through a coupling material having tolerance to high temperature processing. FIG. 1 is a cross-sectional view of a MTJ material stack 101 for a perpendicular STTM device, in accordance with some embodiments of the present invention.

MTJ material stack 101 includes a first metal electrode 107 (e.g., bottom electrode) disposed over a substrate 105. A fixed magnetic material layer or stack 120 including one or more layer of magnetic material is disposed over electrode 107. A tunneling dielectric material layer 130 (e.g., MgO, MgAlO) is disposed over fixed magnetic material layer or stack 120. A free magnetic material layer stack 155 is disposed over tunneling dielectric material layer 130. Free magnetic material stack 155 includes a plurality of free magnetic material layers magnetically coupled through an intervening metal coupling material layer. In the exemplary embodiment a metal coupling material layer 150 is disposed between a first free magnetic material layer 140 and a second free magnetic material layer 160. In the exemplary embodiment illustrated, a dielectric material layer 170, such as a metal oxide (e.g., MgO, VO, WO, TaO, HfO, MoO), is disposed over free magnetic material stack 155. Such a capping layer may be absent for spin-hall effect (SHE) implementations. A second metal electrode 180 (e.g., top electrode) is disposed over the capping dielectric material layer 170. Notably, the order of the material layers 107-180 may be inverted, or extending laterally away from a topographic feature sidewall, in alternative embodiments.

In some embodiments, the material stack shown in FIG. 1 is a perpendicular system, where spins of the magnetic layers are perpendicular to the plane of the material layers (i.e., the magnetic easy axis is in the z-direction out of the plane of substrate 105). Fixed magnetic layer 120 may be composed of any material or stack of materials suitable for maintaining a fixed magnetization direction while the free magnetic material stack 155 is magnetically softer (i.e. magnetization can easily rotate to parallel and antiparallel state with respect to fixed layer). In some embodiments, MTJ structure 101 is based on a CoFeB/MgO system, having an MgO tunneling material layer 130, CoFeB fixed magnetic layer/stack 120, and CoFeB free magnetic layers 140, 160. In advantageous embodiments, all CoFeB layers have body-centered cubic (BCC) (001) out-of-plane texture, where texture refers to the distribution of crystallographic orientations within in the layers of MTJ structure 101. For at least some such embodiments, a high percentage of CoFeB crystals have the preferred (001) out-of-plane orientation (i.e., the degree of texture is high). In some embodiments, the (001) oriented CoFeB magnetic material layers 120, 140, and 160 are iron-rich alloys (i.e., Fe>Co) for increased magnetic perpendicularity. In some embodiments, Fe content is at least 50%. Exemplary embodiments include 20-30% B (e.g., $Co_{20}Fe_{60}B_{20}$). Other embodiments with equal parts cobalt and iron are also possible (e.g., $Co_{40}Fe_{40}B_{20}$). Other magnetic material compositions are also possible for the fixed and/or free magnetic layers, such as but not limited to: Co, Fe, Ni, and non-boron alloys of these metals (e.g., CoFe). In some advantageous embodiments, film thickness of free magnetic layer 140 is 0.6-1.6 nm, while film thickness of free magnetic layer 160 is 0.1-1 nm. Free magnetic layer 140 may be thicker than free magnetic layer 160 to compensate any remaining dead region. In some embodiments however, free magnetic layers 140 and 160 have equal thickness as Mo coupling layers have been found to improve performance in a manner that suggest reduced dead layer thicknesses.

Tunneling dielectric material layer 130 is composed of a material or stack of materials suitable for allowing current of a majority spin to pass through the layer, while impeding current of a minority spin (i.e., a spin filter), impacting the tunneling magnetoresistance associated with MTJ material stack 101. In some exemplary embodiments, dielectric material layer 130 is magnesium oxide (MgO). Dielectric material layer 130 may further provide a crystallization template (e.g., BCC with (001) texture) for solid phase epitaxy of free magnetic material stack 155 and/or fixed magnetic material layer or stack 120.

In some embodiments, layers of a free magnetic material stack are magnetically coupled through a metal coupling layer having high temperature (HT) tolerance. As employed herein, high temperature tolerance of the metal coupling layer is in reference to the ability of the coupling material to maintain desirable free magnetic layer characteristics, (e.g., high stability $\Delta$ and high anisotropy $k_{eff}$) through subsequent thermal treatments associated with integrated circuit device fabrication. Notably, a vacuum thermal anneal (e.g., ~250-300° C.) is typically performed to allow magnetic materials reach a desirable crystallinity and texture from substantially amorphous as-deposited state. However, many processes conventional to MOS transistor integrated circuitry (IC) fabrication are performed at 400° C. The inventors have found that many free magnetic material stacks incorporating a coupling material layer suffer significant degradation in $K_{eff}$ as thermal treatments exceed 300° C., rendering such a MTJ material stack difficult to integrate with MOS transistor IC fabrication.

In some advantageous embodiments, layers of a free magnetic material stack are magnetically coupled through a coupling layer of a metal comprising at least molybdenum (Mo). The Mo may be in pure form or alloyed with other constituents. In advantageous embodiments, the metal coupling material layer is at least predominantly Mo (e.g., Mo is the constituent of greatest proportion in the coupling material). In some exemplary embodiments, the coupling material is elemental Mo (i.e., no other intentional constituents). In alloyed Mo embodiments, the alloy constituents may be substantially absent from the free magnetic materials, or may also be present in the free magnetic materials. In advantageous alloyed Mo embodiments, the Mo alloy has a dominant stable BCC phase. In some exemplary embodiments Mo is alloyed one or more of Ta, W, Nb, V, Hf and Cr. The thickness of the coupling material layer has also been found to be important, advantageously being just a few angstroms to minimize damping. In some embodiments of a Mo coupling layer, the Mo film has a thickness less than 1 nm, and advantageously 0.1 and 0.8 nm.

Figure 2:
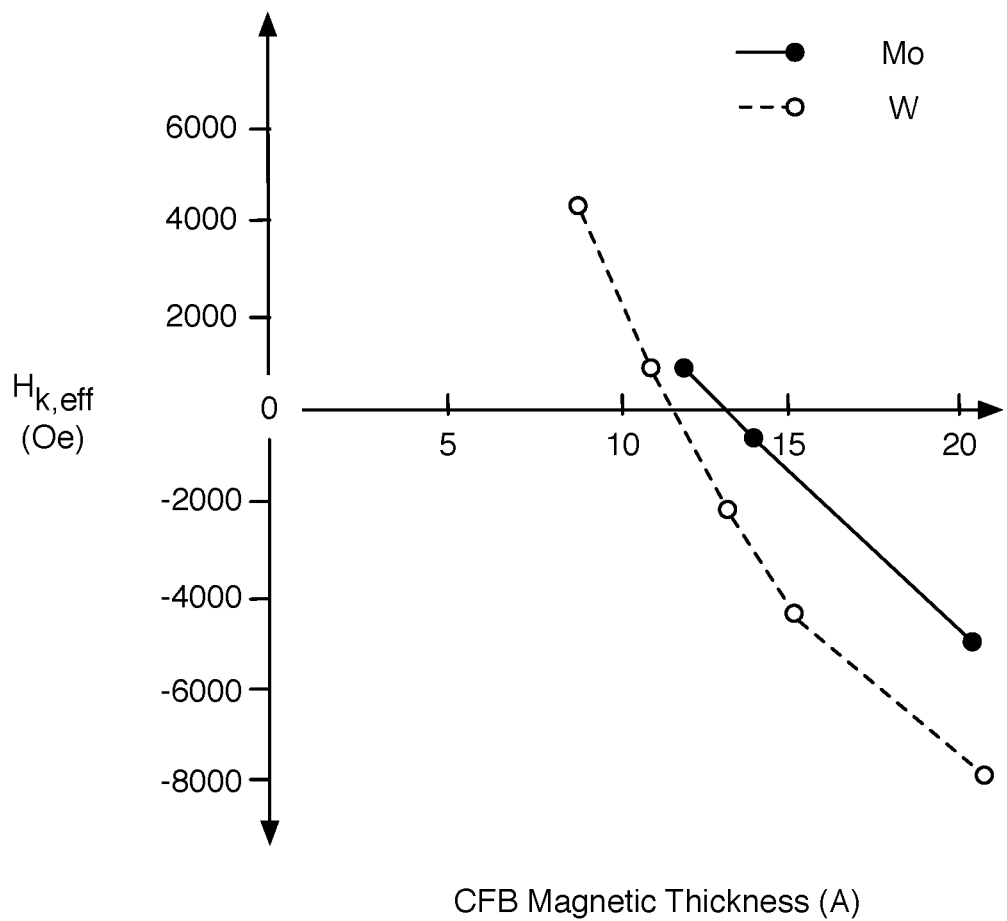
FIG. 2 is a graph of anisotropy field as a function of a magnetic material layer thickness over two different underlayer materials, in accordance with some embodiments.
Figure 3:
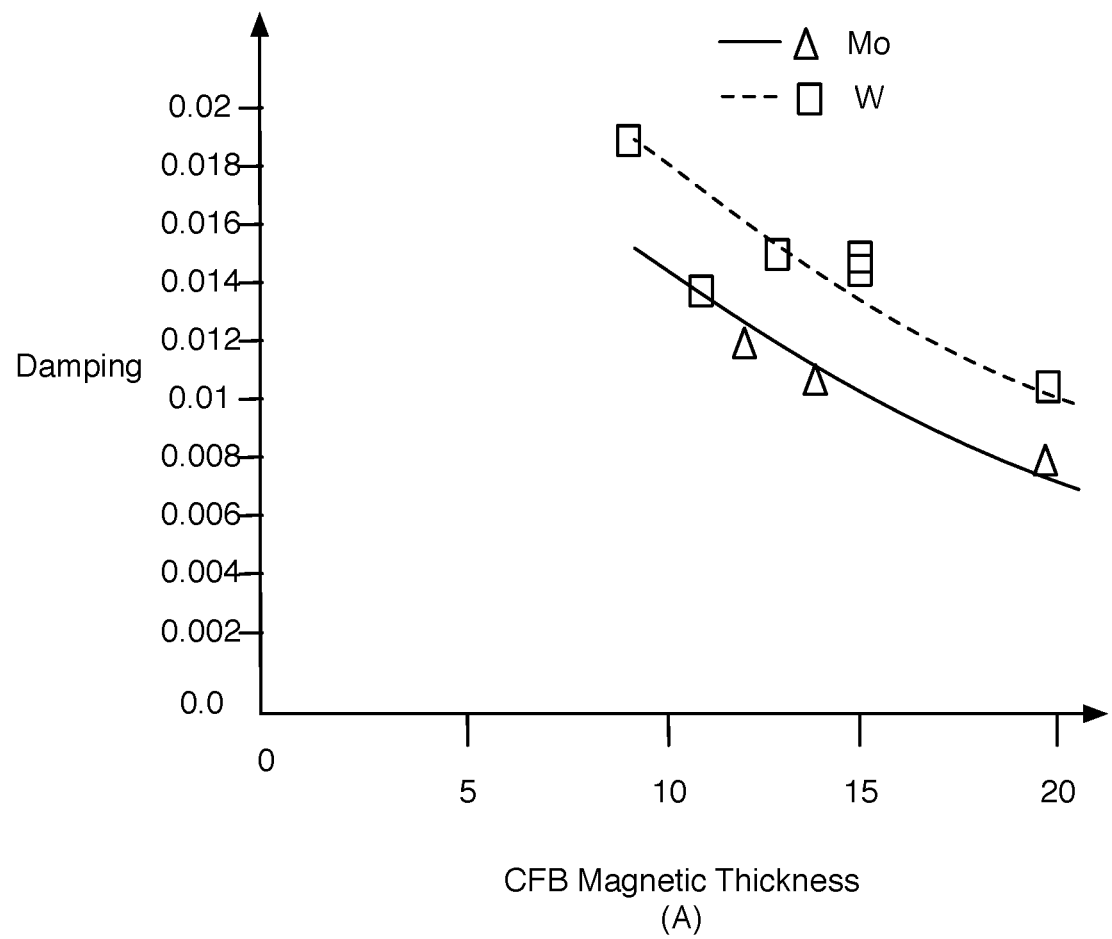
FIG. 3 is a graph of damping as a function of a magnetic material layer thickness over two different underlayer materials, in accordance with some embodiments.
Figure 4:
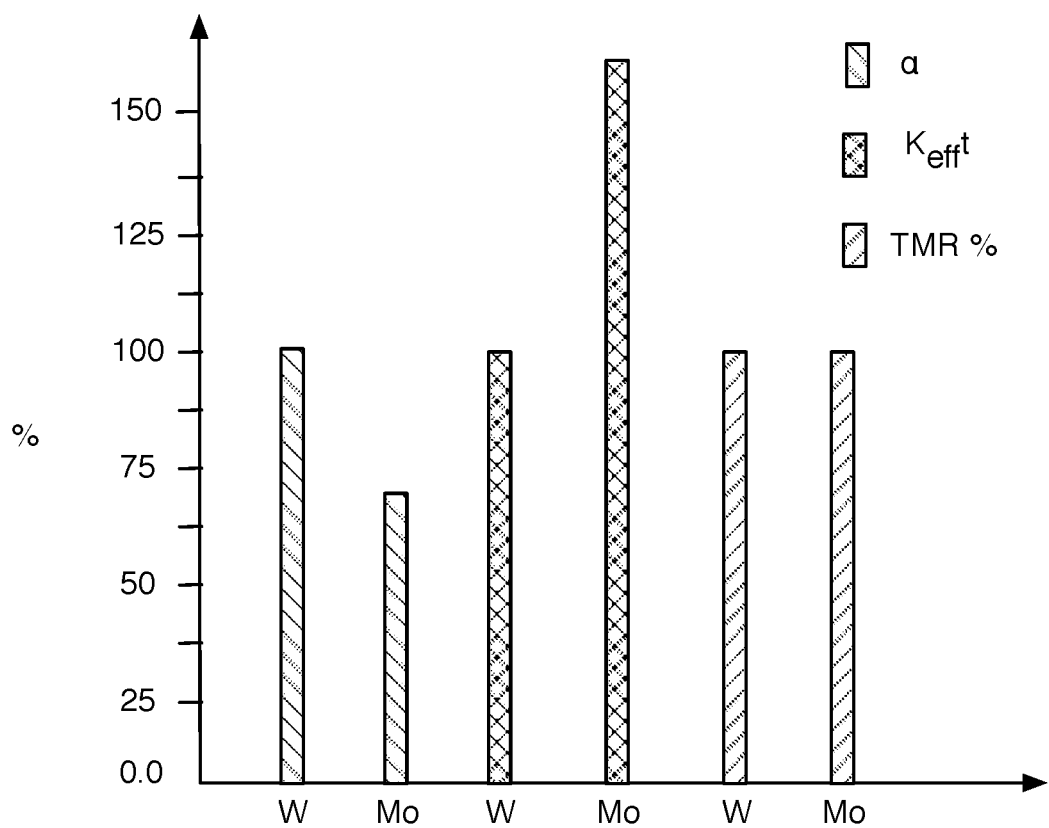
FIG. 4 is a bar chart comparing MTJ performance parameters for two different coupling material layers, in accordance with some embodiments.

The inventors have found Mo superior to various other metal coupling materials (e.g., Tungsten (W), Tantalum (Ta)). Experiments performed with exemplary stacks based on CoFeB/MgO/CoFeB indicate Mo provides a significant improvement in both stability and damping relative to W. FIG. 2 is a graph of anisotropy field as a function of a magnetic material layer thickness over a W underlayer and a (pure) Mo underlayer, in accordance with some embodiments. The illustrated measurements were collected from samples prepared as a partial MTJ stack including a layer of CoFeB (CFB) having a reference composition and of varying thicknesses disposed on a layer of MgO over a silicon dioxide substrate layer. Prior to measurement, the partial stacks were annealed at a temperature of 400° C. for 30 min to simulate subsequent high temperature processing. In FIG. 2, positive values of $H_{k,eff}$ are associated with greater PMA, and therefore advantageous. For at least the thickness range where a direct comparison is made (e.g., 1.2-2.0 nm), the Mo underlayer displays more positive (higher) $H_{k,eff}$. A Mo underlayer also demonstrated lower damping constant. FIG. 3 is a graph of damping as a function of a CoFeB magnetic material layer thickness for the W underlayer and Mo underlayer, in accordance with some embodiments. The illustrated measurements were again collected from samples prepared as a partial MTJ stack including a layer of CoFeB having a reference composition and of varying thicknesses disposed on a layer of MgO over a silicon dioxide substrate layer. As illustrated, damping constant α decreases with increasing CoFeB thickness, as expected. Over the range of magnetic material thicknesses, Mo displays significantly lower damping than W. Lower damping will advantageously reduce the critical current density for the same stability device. FIG. 4 is a bar chart comparing MTJ parameters for W and Mo coupling materials in a free magnetic material stack, in accordance with some embodiments. The illustrated measurements were collected from full MTJ stack including a layer of CoFeB having a reference composition and thickness disposed on a first layer of MgO and capped with a second layer of MgO. As shown, relative to a W coupling layer the free magnetic material stack including the Mo coupling layer has lower damping and higher $K_{eff}*t$ (i.e., high stability) while TMR of the stacks are essentially identical.

A good coupling material is to magnetically couple together the free magnetic material layers directly contacting the coupling material layer such that the coupling material layer increases the effective magnetic thickness of the free magnetic layer, and thereby improves thermal stability of the MTJ for a same given stack area. The coupling material layer has many functions and may have an important role in a variety of physical mechanisms that can impact a MTJ material stack. Film composition and the attendant crystallographic and interface properties may impact, for example, magnetic coupling strength of the insertion material, as well as solid phase epitaxy of the free magnetic layers. Interactions of these parameters introduce complexity in architecting a free magnetic material stack having tolerance to high temperature (e.g., 400° C.) processing. Mo has BCC crystal structure in the most stable phase, which is advantageous for promoting magnetic perpendicularity in free magnetic layers such as CoFeB. The coupling material (and deposition of the coupling layer) might also have a significant role in the formation of magnetic dead zones during high temperature processing, particularly within the free magnetic material layer upon which the coupling material layer is deposited. Although not bound by theory, one possible explanation for the improvement in damping observed for the Mo coupling layer in FIG. 3 is a reduction in magnetic dead zones in the underlying CoFeB free magnetic material, which would increase the effective thickness of the free magnetic material. Although not bound by theory, a reduction in the magnetic dead zone may be attributable to a lower atomic mixing of the underlying free magnetic material. Mo has a much lower atomic number (Z) than W, for example, and as such may be deposited onto the free magnetic material with lower energy. The coupling material layer may also getter dopants from the free magnetic layers (e.g., getter B from CoFeB), which is currently thought to improve the crystallization of the free magnetic layers and thereby improve stability and/or magnetic anisotropy. Low rates of diffusion for the coupling material into the free magnetic material layers may also be important.

In further reference to FIG. 1, it is noted an MTJ stack may vary considerably below tunneling layer 130 without deviating from the scope of the embodiments of the present invention. For example, one or more intermediate layer may be disposed between the fixed magnetic material layer 120 and adjacent contact metallization 107. In some embodiments, an anti-ferromagnetic layer, such as, but not limited to, iridium manganese (IrMn) or platinum manganese (PtMn), or a synthetic antiferromagnetic (SAF) structure may be incorporated into an MTJ stack that includes free magnetic material stack 155. SAF structures may be useful for countering a fringing magnetic field associated with fixed magnetic material layer 120. Such additional material layers may be considered part of a multi-layered fixed magnetic material stack.

Figure 5A:
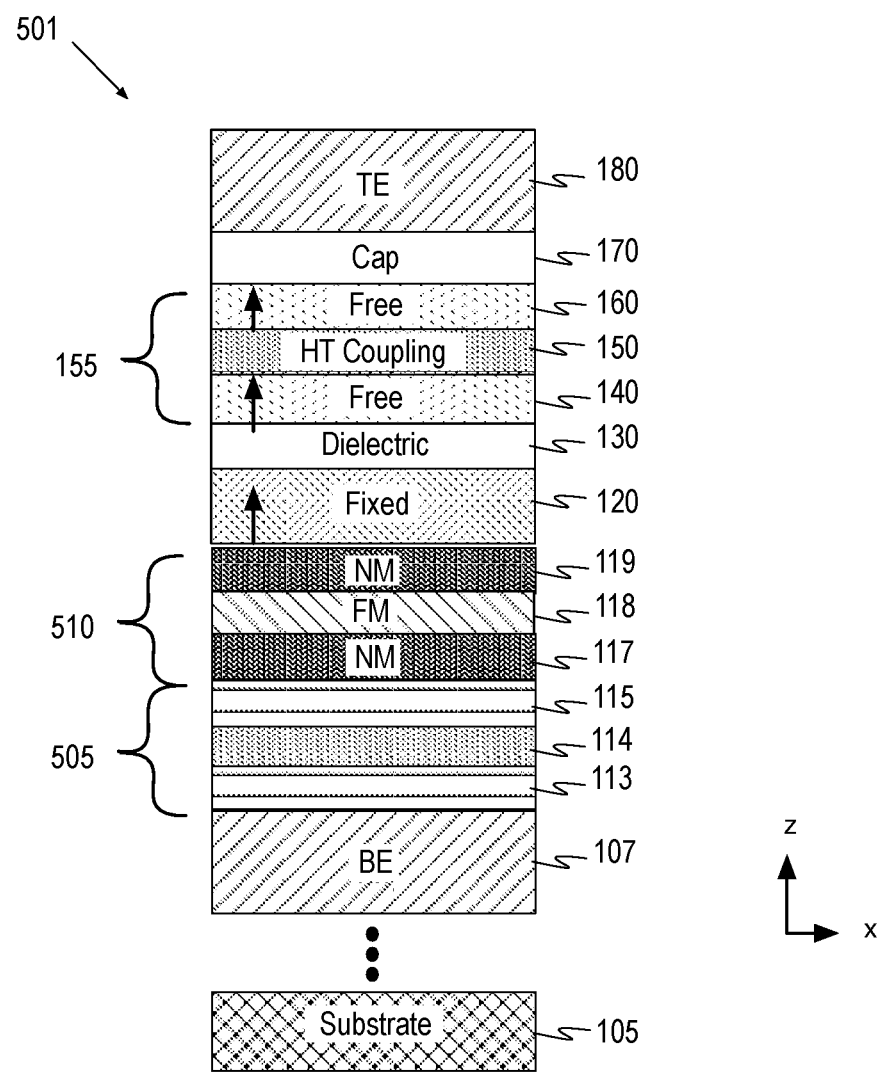
FIG. 5A is a cross-sectional view of a material layer stack for a pSTTM device further including a multi-layered filter stack, in accordance with some further embodiments of the present invention.

FIG. 5A is a cross-sectional view of a material layer stack for a pSTTM device 501 further including a multi-layered filter stack, in accordance with some further embodiments of the present invention. The material stack includes a SAF stack 505 disposed over metal electrode 107. Although not depicted, one or more material layers may be disposed between SAF stack 505 and metal electrode 107 and/or metal electrode 107 may comprise a plurality of material layers. In some exemplary embodiments, SAF stack 505 includes a first plurality of bilayers 113 forming a superlattice of ferromagnetic material (e.g., Co, CoFe, Ni) and a nonmagnetic material (e.g., Pd, Pt, Ru). Bi-layers 113 may include n bi-layers (e.g., n [Co/Pt] bilayers, or n [CoFe/Pd] bilayers, etc.) that are separated from a second plurality of bilayers 115 (e.g., p [Co/Pt]) by an intervening non-magnetic spacer 114. Layer thicknesses within bi-layers 113 and 115 may range from 0.1-0.4 nm, for example. Spacer 114 provides the antiferromagnetic coupling between 113 and 115. Spacer 114 may be a Ruthenium (Ru) layer less than 1 nm thick, for example.

Disposed over SAF stack 505 is a multi-layered filter stack 510 having high temperature (HT) tolerance. As employed herein, high temperature tolerance of the filter stack is in reference to the ability of the filter to maintain desirable fixed magnetic layer characteristics impacting temperature stability and TMR of the material stack through subsequent thermal treatments associated with integrated circuit device fabrication (e.g., 400° C.).

In exemplary embodiments, filter stack 510 includes at least one ferromagnetic (FM) material layer 118 disposed between a first non-magnetic (NM) material layer 117 and second NM material layer 119. FM material layer 118 may be of any ferromagnetic composition, such as but not limit to Co, Fe, Ni, and alloys of these metals. In some advantageous embodiments, FM material layer 118 is CoFeB. The CoFeB composition may be the same as that of fixed magnetic material layer(s) 120, and/or the same as that of free magnetic material layer(s) 140. In some CoFeB embodiments where both fixed magnetic layer(s) 120 and free magnetic(s) 140 are Fe-rich (Fe>Co), FM material layer 118 is also Fe-rich CoFeB, and may be 50-60% Fe. In some Fe-rich CoFeB embodiments, each of magnetic material layers 118, 120, 140 is CoFeB with 20-30% B (e.g., $Co_{20}Fe_{60}B_{20}$).

In accordance with some embodiments of multi-layered filter stack 510, at least one of NM material layers 117, 119 comprises a transition metal selected from the group consisting of Ta, Mo, Nb, W, and Hf. The transition metal may be in pure form or alloyed with other constituents. In advantageous embodiments, at least one NM material layer in filter stack 510 is predominantly (i.e., the constituent of greatest proportion in the NM material layer) one of Ta, Mo, Nb, and Hf. In some advantageous embodiments, at least one NM material layer in filter stack 510 is Ta (i.e., an NM material layer consists only of Ta).

In accordance with further embodiments, both NM material layers 117, 119 comprises a transition metal selected from the group consisting of Ta, Mo, Nb, and Hf. In accordance with some such embodiments, both NM material layers 117, 119 comprise the same transition metal selected from the group consisting of Ta, Mo, Nb, and Hf. For example, in some embodiments both NM material layers 117 and 119 consist of Ta, or comprise Ta in a Ta alloy of the same composition). In accordance with alternative embodiments, NM material layers 117, 119 comprise a different transition metal selected from the group consisting of Ta, Mo, Nb, and Hf, or comprise different alloys thereof. For example, in some embodiments a first of NM material layers 117 and 119 consists of Ta, or comprises Ta in a first Ta alloy, while a second of NM material layers 117 and 119 consists of Mo, Nb, Hf, comprises Ta in a second Ta alloy, or comprises an alloy of Mo, Nb, or Hf.

In accordance with other embodiments, only one of NM material layers 117, 119 comprises a transition metal selected from the group consisting of Ta, Mo, Nb, and Hf, while the other NM material layer is an alternate metal, such as, but not limited to W, and alloys thereof.

The thickness of the NM material layers in filter stack 510 has also been found to be important with greater thicknesses permissible for materials providing stronger magnetic coupling. In some embodiments, FM material layer 118 has a thickness less than 1 nm, and for CoFeB embodiments is advantageously 0.4-0.9 nm. In some exemplary Fe-rich 20% B embodiments (e.g., $Co_{20}Fe_{60}B_{20}$), FM material layer 118 has a thickness between 0.7 and 0.9 nm. NM material layers 117, 119 may also have thicknesses less than 1 nm, and advantageously 0.1 nm-0.5 nm. In some embodiments, thicknesses of NM material layers 117 and 119 are not equal. For example, thickness of NM material layer 119 may be thicker than NM material layer 117 by at least 0.1 nm, with each having a thickness of 0.2-0.5 nm.

Fixed magnetic material layer 120 and free magnetic material stack 155 are disposed over filter stack 510. Free magnetic material stack 155 includes, for example, a Mo-based metal coupling material layer having one or more of the properties described above in the context of MTJ material stack 101.

Figure 5B:
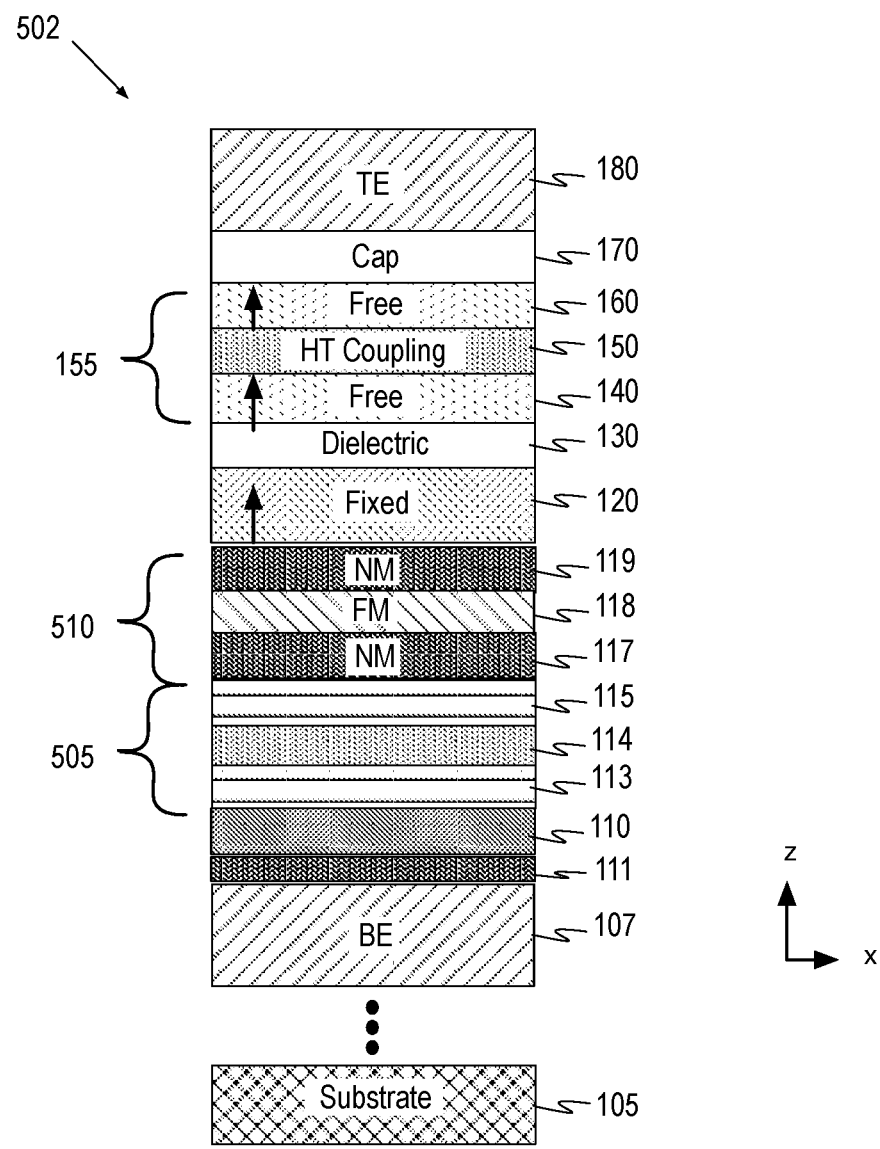
FIG. 5B is a cross-sectional view of a material layer stack for a pSTTM device further including an electrode interface material layer/stack, in accordance with some further embodiments of the present invention.

FIG. 5B is a cross-sectional view of a material layer stack for a pSTTM device 502 further including an electrode interface material layer/stack 110, in accordance with some further embodiments of the present invention. In the exemplary embodiment illustrated, electrode interface material layer or stack 110 is disposed between electrode 107 and SAF stack 505. A seed layer 111 is further disposed between SAF stack 505 and interface material layer/stack 110. The seed layer may be of a material having suitable composition and microstructure to promote advantageous crystallinity in SAF stack 505. In some embodiments, the seed layer 111 comprises Pt and may be a substantially pure Pt (i.e. not intentionally alloyed). A seed layer of Pt is well-suited as an underlayer of a Co/Pt-based SAF structure. Electrode interface material layer or stack 110 is to promote an advantageous FCC structure with (111) texture in the seed layer. A Pt seed layer often deposits with FCC structure unless strongly templated by an underlayer. The presence of electrode interface material layer/stack 110 is to prevent seed layer from templating its crystal structure based on electrode 107, such as a surface of TiN. As such, electrode interface material layer/stack 110 may then be considered a crystal enhancing layer, enhancing the crystallinity of seed layer (and SAF stack 505, etc.) relative to the crystallinity achieved when seed layer 111 is deposited directly on electrode 107.

In accordance with some embodiments, electrode interface material/stack 110 includes at least one material layer comprising CoFeB. For example, a single CoFeB material layer may be in direct contact with both metal electrode 107 and seed layer 111. For CoFeB electrode interface embodiments, seed layer 111 should be sufficiently thick to avoid magnetic coupling to electrode interface material/stack 110. For exemplary Pt seed layer embodiments, the Pt layer advantageously has a thickness of at least 2 nm (e.g., 2-5 nm).

A CoFeB material layer 110 may have a wide range of compositions as magnetic properties need not be optimized in the manner typical for free and/or fixed magnetic layers. In some advantageous embodiments, CoFeB material layer 110A has the same composition as that of fixed magnetic material layer(s) 120, and/or the same as that of free magnetic material layer(s) 140. CoFeB material layer 110A may have a thickness between 0.4 and 5 nm.

In accordance with some further embodiments, electrode interface material/stack 110 includes a CoFeB material layer in direct contact with seed layer 111 and a Ta material layer in direct contact with metal electrode 107. The addition of Ta material layer may improve adhesion of CoFeB material layer to metal electrode 107 (e.g., a TiN material). The Ta material layer may have a thickness of 5 nm or less (e.g., 1-5 nm), for example.

In accordance with some further embodiments, electrode interface material/stack 110 includes a Ta material layer in direct contact with seed layer 111, and a Ru material layer in direct contact with metal electrode 107. The inventors have found Ru deposited with HCP crystallinity promotes BCC crystallinity in a Ta material layer, which has further been found to favor formation of FCC crystallinity and (111) texture within seed layer 111. The Ru material layer may have a thickness of 20 nm or less, and advantageously 10-20 nm.

In accordance with some further embodiments, electrode interface material/stack 110 includes a Ta material layer in direct contact with the seed layer 111 and in direct contact with metal electrode 107. The inventors have found an elemental (pure) Ta can be employed without CoFeB or Ru if the Ta material layer is limited to less than 2 nm, and advantageously 1.0-1.5 nm. The inventors have found crystallinity for Ta limited to less than 1.5 nm in thickness favors formation of FCC crystallinity and (111) texture within the seed layer.

Figure 6:
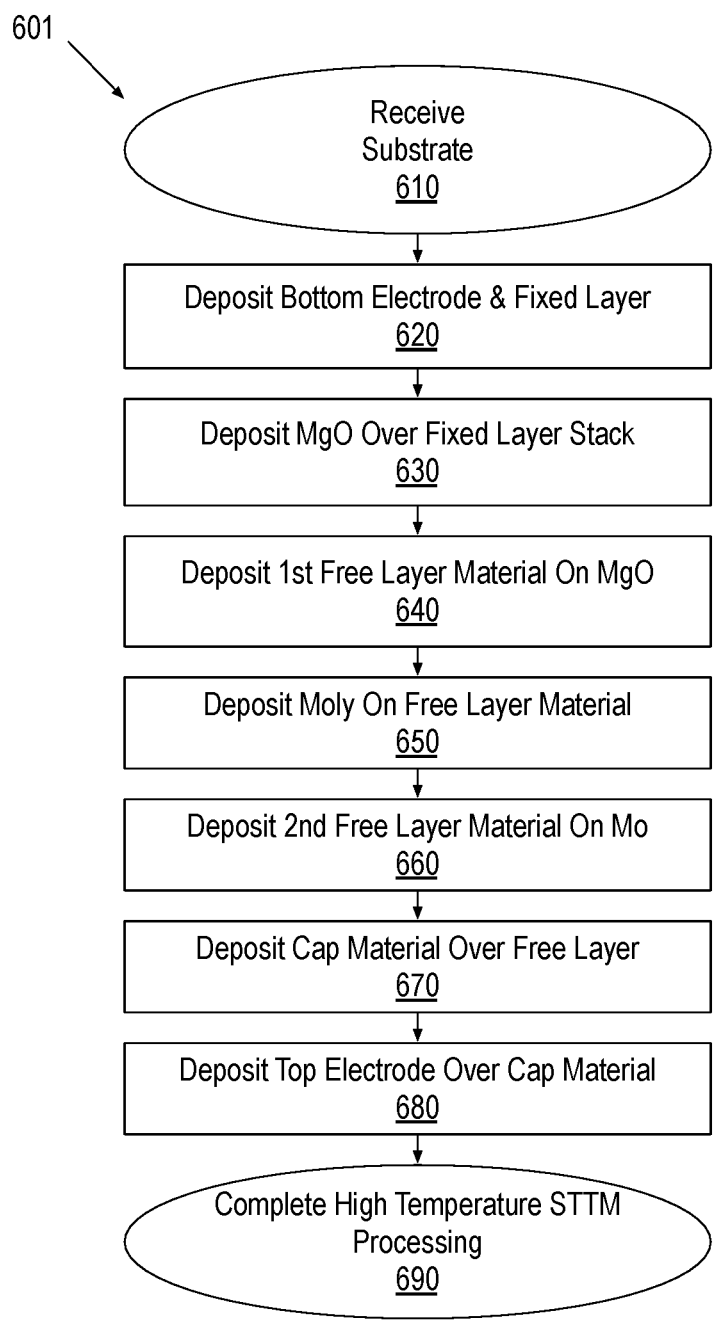
FIG. 6 is a flow diagram illustrating a method of fabricating the STTM device illustrated in FIG. 1 or FIG. 2, in accordance with some embodiments.

MTJ material stacks in accordance with the architectures above may be fabricated by a variety of methods applying a variety of techniques and processing chamber configurations. FIG. 6 is a flow diagram illustrating a method 601 for fabricating the STTM device illustrated in FIG. 1, in accordance with some embodiments. Method 601 begins with receiving a substrate at operation 610. Any substrate known to be suitable for microelectronic fabrication may be received, such as, but not limited to crystalline silicon substrates. Transistors and/or one or more levels of interconnect metallization may be present on the substrate as received at operation 610.

At operation 620, a bottom electrode metal, fixed magnetic layer or material stack, and underlayers, such as a SAF structure, are deposited. At operation 630, a tunneling dielectric material, such as MgO, is deposited directly on the fixed magnetic layer. At operation 640 a first free magnetic material layer, such as Fe-rich CoFeB, is deposited directly on the tunneling dielectric material. At operation 650, a coupling material, such as a Mo layer or Mo alloy layer, is deposited directly on the first free magnetic material. At operation 660, a second free magnetic material layer, such as Fe-rich CoFeB, is deposited directly on the Mo coupling material. At operation 670, a dielectric cap material, such as MgO, is deposited over the second free layer. Deposition of dielectric cap material is optional, and may be omitted from the fabrication process for a spin-hall effect implementation of pSTTM, for example. At operation 680, a top electrode metal is deposited over the cap material. In exemplary embodiments, operations 620, 630, 640, 650, 660, 670, and 680 all entail a physical vapor deposition (sputter deposition) performed at a temperature below 250° C. One or more of co-sputter and reactive sputtering may be utilized in any capacity known in the art to form the various layer compositions described herein. For PVD embodiments, one or more of the material layers, such as but not limited to the magnetic fixed and free material layers, are deposited in amorphous form that may be discontinuous over a substrate area (e.g., forming islands that do not coalesce). Alternate deposition techniques, such as atomic layer deposition (ALD) may be performed for those materials having precursors known to be suitable. Alternatively, epitaxial processes such as, but not limited to, molecular beam epitaxy (MBE) may be practiced to grow one or more of the MTJ material layers. For one or more of these alternative deposition techniques, at least the magnetic material layers may be deposited with at least some microstructure (e.g., polycrystalline with texture).

After one or more layers of the MTJ material stack (e.g., all layers) are deposited, an anneal is performed under any conditions known in the art to promote solid phase epitaxy of the free magnetic layers and/or fixed magnetic layer imparting polycrystalline BCC microstructure and (001) texture. Anneal temperatures, durations, and environments may vary with exemplary embodiments performing an anneal at 250° C., or more. Method 601 is completed at operation 690 where high temperature STTM and/or MOS transistor IC processing is performed, for example at a temperature of at least 400° C. Any standard microelectronic fabrication processes such as lithography, etch, thin film deposition, planarization (e.g., CMP), and the like may be performed to complete delineation and/or interconnection of an STTM device employing any of the MTJ material stacks described herein or a subset of the material layers therein.

In an embodiment, the MTJ functions essentially as a resistor, where the resistance of an electrical path through the MTJ may exist in two resistive states, either "high" or "low," depending on the direction or orientation of magnetization in the free magnetic layer(s) and in the fixed magnetic layer(s). In the case that the spin direction is down (minority) in the free magnetic layer(s), a high resistive state exists and the directions of magnetization in the coupled free magnetic layer(s) and the fixed magnetic layer(s) are substantially opposed or anti-parallel with one another. In the case that the spin direction is up (majority) in the coupled free magnetic layers, a low resistive state exists, and the directions of magnetization in the coupled free magnetic layers and the fixed magnetic layer are substantially aligned or parallel with one another. The terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the coupled free magnetic layers may be switched through a process called spin transfer torque ("STT") using a spin-polarized current. An electrical current is generally non-polarized (e.g. consisting of about 50% spin-up and about 50% spin-down electrons). A spin-polarized current is one with a greater number of electrons of either spin-up or spin-down. The spin-polarized current may be generated by passing a current through the fixed magnetic layer. The electrons of the spin polarized current tunnel from the fixed magnetic layer tunnel through the tunneling barrier or dielectric layer 208 and transfers its spin angular momentum to the free magnetic layer, wherein the free magnetic layer will orient its magnetic direction from anti-parallel to that of the fixed magnetic layer or parallel. The spin-hall effect may also be employed to generate spin-polarized current through a particular electrode material that is in contact with a free magnetic material layer. For such embodiments, the free magnetic layer may be oriented without applying current through the fixed magnetic layer and other material layers of the MTJ. In either implementation, the free magnetic layer may be returned to its original orientation by reversing the current. Thus, the MTJ may store a single bit of information ("0" or "1") by its state of magnetization. The information stored in the MTJ is sensed by driving a current through the MTJ. The free magnetic layer(s) does not require power to retain its magnetic orientations. As such, the state of the MTJ is preserved when power to the device is removed. Therefore, a spin transfer torque memory bit cell composed of the material stacks described herein is non-volatile.

Figure 7:
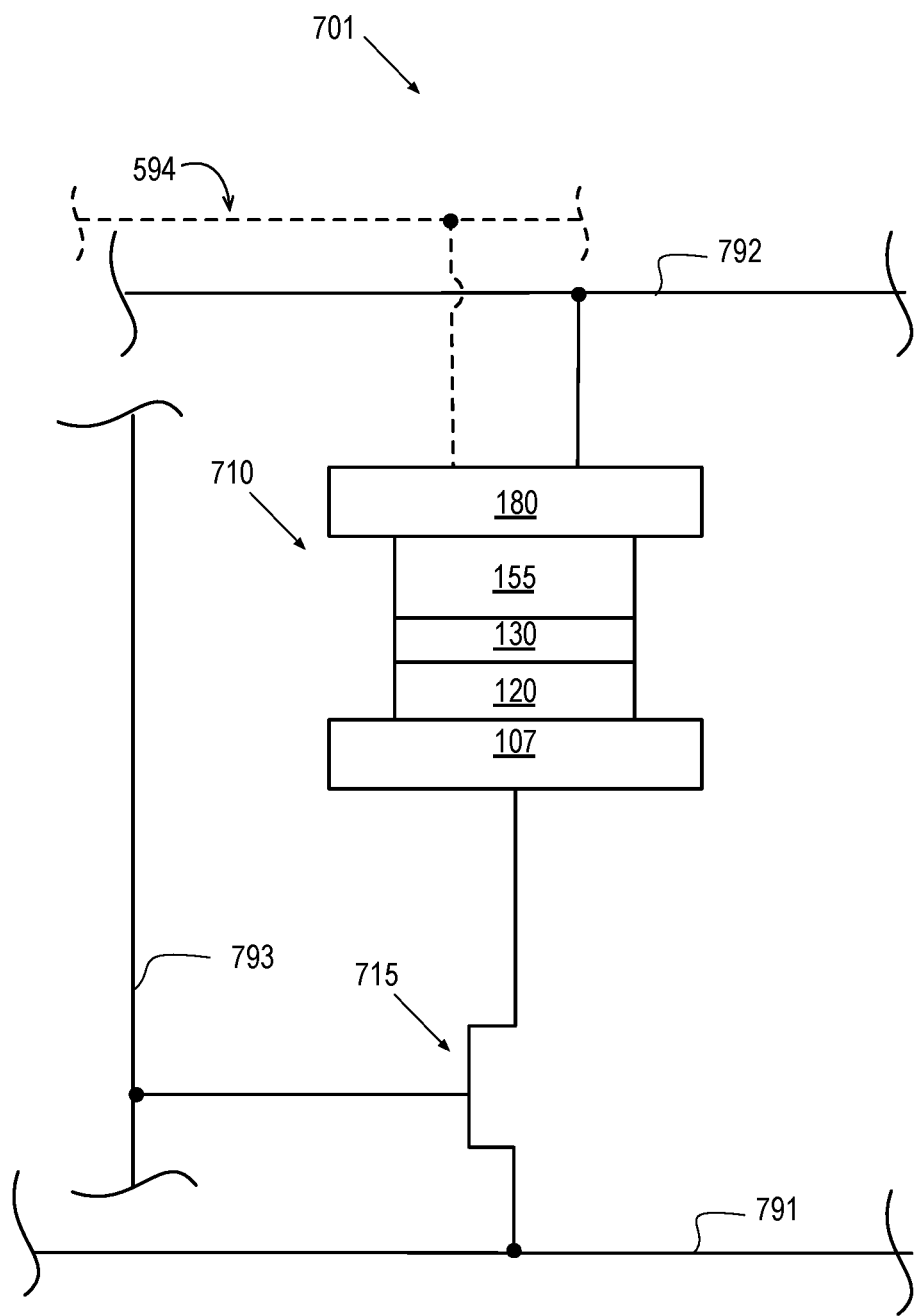
FIG. 7 is a schematic of a STTM bit cell, which includes a spin transfer torque element, in accordance with an embodiment of the present invention.

FIG. 7 is a schematic of a STTM bit cell 701, which includes a spin transfer torque element 710, in accordance with an embodiment of the present invention. The spin transfer torque element 710 includes a free magnetic material stack 155 including at least two layers of magnetic material that are magnetically coupled through one or more intervening metal layer comprising Mo. Element 710 further includes first metallization 107 proximate to fixed magnetic layer 120, and tunneling layer 130 disposed between free magnetic material stack 155 and fixed magnetic layer 120, and a second metallization 180 proximate to free magnetic material stack 155. Second metallization 180 is electrically coupled to a first metal interconnect 792 (e.g., bit line). First metallization 107 is electrically connected to a second metal interconnect 791 (e.g., source line) through a transistor 715. The transistor 715 is further connected to a third metal interconnect 793 (e.g., word line) in any manner conventional in the art. In SHE implementations second metallization 180 is further coupled to a fourth metal interconnect 794 (e.g., maintained at a reference potential relative to first metal interconnect 792). The spin transfer torque memory bit cell 701 may further include additional read and write circuitry (not shown), a sense amplifier (not shown), a bit line reference (not shown), and the like, as understood by those skilled in the art of solid state non-volatile memory devices. A plurality of the spin transfer torque memory bit cell 710 may be operably connected to one another to form a memory array (not shown), wherein the memory array can be incorporated into a non-volatile memory device.

Figure 8:
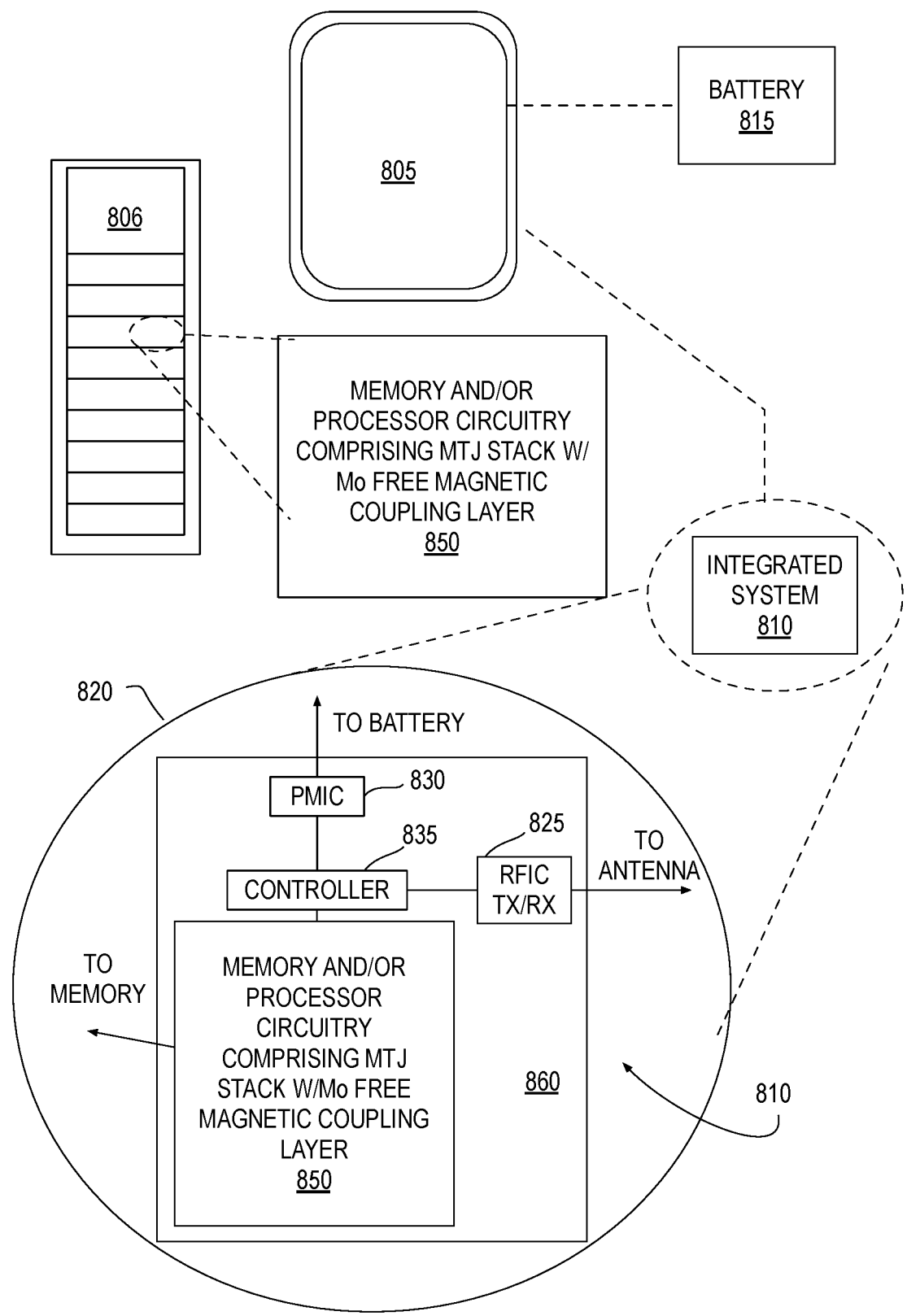
FIG. 8 is a schematic illustrating a mobile computing platform and a data server machine employing STTM arrays, in accordance with embodiments of the present invention.

FIG. 8 illustrates a system 800 in which a mobile computing platform 805 and/or a data server machine 806 employs MTJ material stacks including a Mo-based free magnetic coupling layer, for example in accordance with embodiments of the present invention described above. The server machine 806 may be any commercial server, for example including any number of high-performance computing platforms disposed within a rack and networked together for electronic data processing, which in the exemplary embodiment includes a packaged device 850.

The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as a stand-alone packaged device within the server machine 806, SOC 860 includes at least MTJ material stacks including a Mo-based free magnetic coupling layer. SOC 560 may further include a memory circuitry and/or a processor circuitry 840 (e.g., STTM, MRAM, a microprocessor, a multi-core microprocessor, graphics processor, etc.). Any of controller 835, PMIC 830, or RF (radio frequency) integrated circuitry (RFIC) 825 may include embedded STTM employing MTJ material stacks including a Mo-based free magnetic coupling layer.

As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 9:
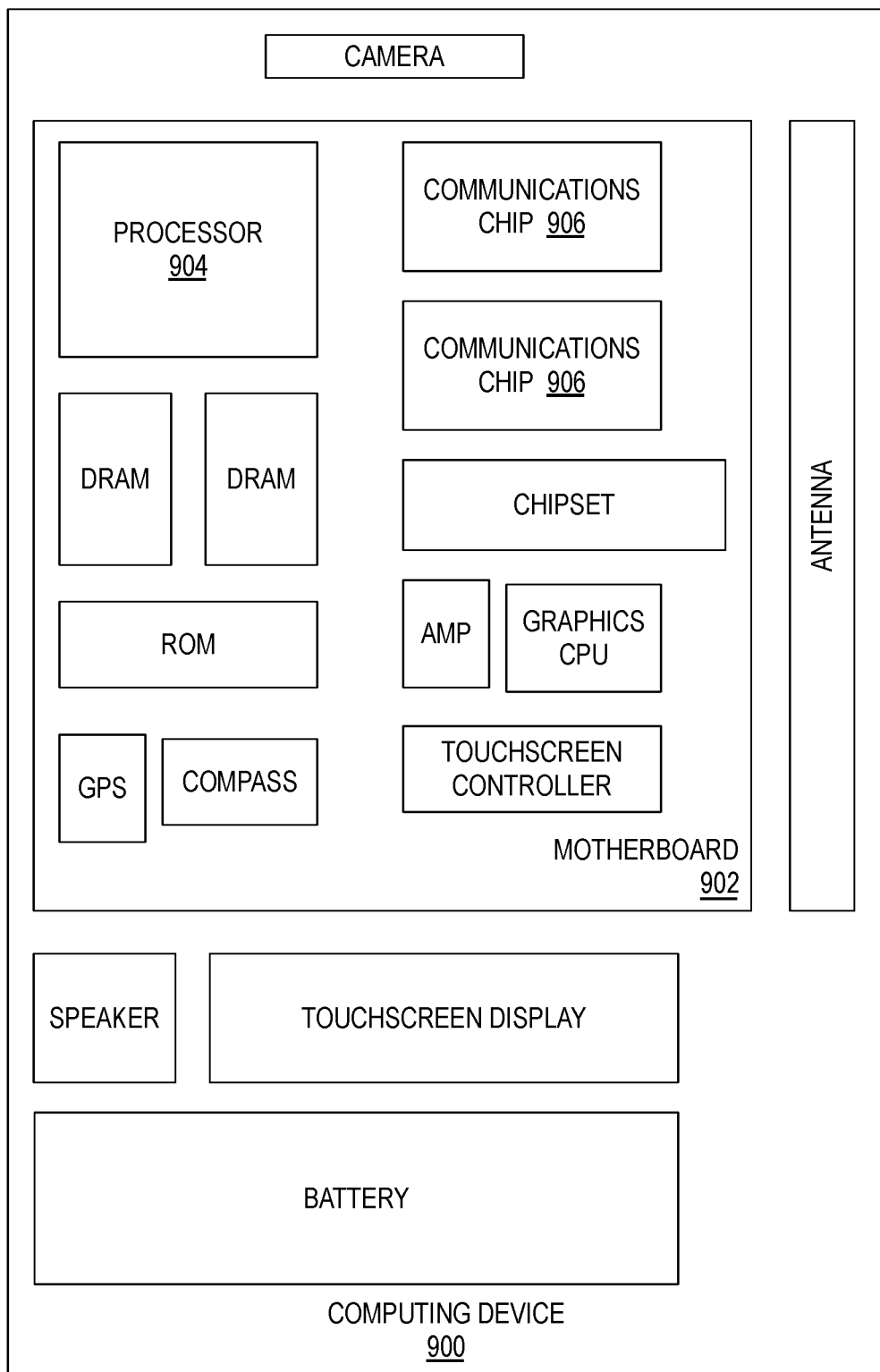
FIG. 9 is a functional block diagram illustrating an electronic computing device, in accordance with an embodiment of the present invention.

FIG. 9 is a functional block diagram of a computing device 900, arranged in accordance with at least some implementations of the present disclosure. Computing device 900 may be found inside platform 905 or server machine 906, for example. Device 900 further includes a motherboard 902 hosting a number of components, such as, but not limited to, a processor 904 (e.g., an applications processor), which may further incorporate embedded magnetic memory based on MTJ material stacks including a Mo-based free magnetic coupling layer, in accordance with embodiments of the present invention. Processor 904 may be physically and/or electrically coupled to motherboard 902. In some examples, processor 904 includes an integrated circuit die packaged within the processor 904. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below:

In one or more first embodiments, a magnetic tunneling junction (MTJ) material layer stack disposed over a substrate, the stack comprises a fixed magnetic material layer or stack comprising one or more layer of magnetic material, a free magnetic material stack further comprising a metal coupling layer disposed between two magnetic material layers, wherein the metal coupling layer comprises at least molybdenum (Mo), and a first layer of dielectric material disposed between the fixed magnetic material layer or stack, and the free magnetic material layer.

In furtherance of the first embodiments, the magnetic material layers have perpendicular magnetic anisotropy, the metal coupling layer is in direct contact with each of the two magnetic material layers, and the metal coupling layer has a film thickness of 0.1 nm-1 nm.

In furtherance of the first embodiments immediately above, the metal coupling layer is at least predominantly Mo and has a film thickness of 0.1 nm-0.8 nm.

In furtherance of the first embodiments, the metal coupling layer comprises Mo alloyed with at least one of Ta, W, Nb, V, Hf, or Cr.

In furtherance of the first embodiments, the magnetic material layers each comprise CoFeB, the first dielectric material layer comprises MgO, and the stack further comprises a synthetic antiferromagnet (SAF) structure disposed between the fixed magnetic material layer or stack and a metal electrode.

In furtherance of the first embodiments, the CoFeB layers each comprises at least at least 50% Fe, a first of the CoFeB layers disposed between the metal coupling layer and the first dielectric layer has a greater thickness than that of a second of the CoFeB layers disposed on a side of the metal coupling layer opposite the first of the CoFeB layers.

In furtherance of the first embodiments, the material stack further comprises a second layer of dielectric material disposed on a side of the free magnetic material stack opposite the first layer of dielectric material, wherein the second layer of dielectric material comprises at least one of: MgO, VO, TaO, HfO, ZrO, WO, or TiO.

In one or more second embodiment, a non-volatile memory cell comprises a first electrode, a second electrode coupled to a bit line of a memory array, the MTJ material stack in any one of the first embodiments, and a transistor with a first terminal electrically coupled to the first electrode, a second terminal electrically coupled to a source line of the memory array, and a third terminal electrically coupled to a word line of the memory array.

In one or more third embodiments, a non-volatile memory cell comprises a first electrode, a second electrode coupled to a bit line of a memory array, and a MTJ material stack disposed between the first and second electrodes, wherein the MTJ material stack further comprises a fixed magnetic material layer or stack comprising one or more layer of magnetic material, a free magnetic material layer comprising at least two layers of magnetic material that are magnetically coupled through one or more intervening metal coupling layer comprising molybdenum (Mo), and a dielectric layer disposed between the fixed magnetic material layer and the free magnetic material layer. The memory cell further comprises a transistor with a first terminal electrically coupled to the first electrode, a second terminal electrically coupled to a source line of the memory array, and a third terminal electrically coupled to a word line of the memory array.

In furtherance of the third embodiments, the magnetic material layers have perpendicular magnetic anisotropy, and the metal coupling layer has a film thickness of 0.1 nm-1 nm.

In furtherance of the third embodiments immediately above, the metal coupling layer is at least predominantly Mo and has a film thickness of between 0.1 nm and 0.8 nm.

In furtherance of the third embodiments immediately above, the metal coupling layer consists of Mo.

In furtherance of the third embodiments, the magnetic material layers each comprise CoFeB, the first dielectric layer comprises MgO, and the fixed magnetic layer comprises a synthetic antiferromagnet (SAF).

In one or more fourth embodiments, a mobile computing platform includes a non-volatile memory comprising a plurality of the non-volatile memory cell of any of the third embodiments, a processor communicatively coupled to the non-volatile memory, a battery coupled to the processor, and a wireless transceiver.

In one or more fifth embodiments, a method of forming a magnetic tunneling junction (MTJ) material stack comprises depositing a first layer of a dielectric material over a substrate, depositing a first layer of amorphous CoFeB over the first layer of a dielectric material, depositing a metal coupling layer comprising at least molybdenum (Mo) over the first layer of amorphous CoFeB, depositing a second layer of amorphous CoFeB over the first layer of a dielectric material, depositing a second layer of dielectric material over the second layer of CoFeB, and annealing the MTJ stack at a temperature of at least 250° C. to convert the amorphous CoFeB into polycrystalline CoFeB with <001> texture.

In furtherance of the third embodiments immediately above, depositing the MTJ stack further comprises sputter depositing all of the layers at a temperature below 250° C.

In furtherance of the third embodiments, depositing the metal coupling layer further comprises depositing a metal that is at least predominantly Mo to a film thickness of between 0.1 nm and 0.8 nm.

In furtherance of the third embodiments immediately above, depositing the metal coupling layer further comprises depositing Mo to a film thickness of between 0.1 nm and 0.8 nm.

In furtherance of the third embodiments, depositing the first layer of amorphous CoFeB over the first layer of a dielectric material further comprises depositing the first layer of amorphous CoFeB directly on the first layer of a dielectric material. Depositing the metal coupling layer comprising at least molybdenum (Mo) over the first layer of amorphous CoFeB further comprises depositing the metal coupling layer comprising at least molybdenum (Mo) directly on the first layer of amorphous CoFeB. Depositing the second layer of amorphous CoFeB over the first layer of a dielectric material further comprises depositing the second layer of amorphous CoFeB directly on the first layer of a dielectric material. Depositing the second layer of dielectric material over the second layer of CoFeB further comprises depositing the second layer of dielectric material directly on the second layer of CoFeB.

In furtherance of the third embodiments, the method further comprising exposing the MTJ stack at a temperature of at least 400° C. during subsequent material processing.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A magnetic tunneling junction (MTJ) structure over a substrate, the structure comprising:
   a fixed magnetic material layer or stack comprising one or more layers of magnetic material;
   a free magnetic material stack further comprising:
      a metal coupling layer between two magnetic material layers, wherein the two magnetic material layers each comprise CoFeB and have perpendicular magnetic anisotropy, and wherein the metal coupling layer comprises at least molybdenum (Mo);
   a first layer of dielectric material between the free magnetic material stack and the fixed magnetic material layer or stack, wherein the first layer of dielectric material comprises Mg; and
   a second layer of dielectric material on a side of the free magnetic material stack opposite the first layer of dielectric material, wherein the second layer of dielectric material comprises an oxide of at least one of: Mg, V, Ta, Hf, Zr, O, or Ti.

2. The MTJ structure of claim 1, wherein:
   the metal coupling layer is in direct contact with each of the two magnetic material layers.

3. The MTJ structure of claim 2, wherein the metal coupling layer is at least predominantly Mo.

4. The MTJ structure of claim 2, wherein the metal coupling layer comprises Mo alloyed with at least one of Ta, W, Nb, V, Hf, or Cr.

5. The MTJ structure of claim 1, wherein:
   the structure further comprises a synthetic antiferromagnet (SAF) structure between a metal electrode and the fixed magnetic material layer or stack.

6. The MTJ structure of claim 5, wherein:
the CoFeB layers each comprises at least at least 50% Fe;
a first of the CoFeB layers between the metal coupling layer and the first dielectric layer has a greater thickness than that of a second of the CoFeB layers that is on a side of the metal coupling layer opposite the first of the CoFeB layers.

7. A non-volatile memory cell, comprising:
a first electrode;
a second electrode coupled to a bit line of a memory array;
the MTJ structure of claim 1; and
a transistor with a first terminal electrically coupled to the first electrode, a second terminal electrically coupled to a source line of the memory array, and a third terminal electrically coupled to a word line of the memory array.

8. A non-volatile memory device, comprising:
a first electrode;
a second electrode coupled to a bit line of a memory array;
a MTJ structure between the first and second electrodes, wherein the MTJ structure further comprises:
 a fixed magnetic material stack comprising one or more layers of magnetic material and a synthetic antiferromagnet (SAF);
 a free magnetic material stack comprising at least two layers of magnetic material that each comprise CoFeB and have perpendicular magnetic anisotropy, and that are magnetically coupled through an intervening metal coupling layer comprising molybdenum (Mo), wherein the metal coupling layer has a film thickness of 0.1 nm-1 nm, and wherein the metal coupling layer is at least predominantly Mo; and
 a dielectric layer between the fixed magnetic material stack and the free magnetic material stack, wherein the layer of dielectric material comprises Mg; and
a transistor with a first terminal electrically coupled to the first electrode, a second terminal electrically coupled to a source line of the memory array, and a third terminal electrically coupled to a word line of the memory array.

9. The memory device of claim 8, wherein the metal coupling layer consists of Mo.

10. A mobile computing platform comprising:
a non-volatile memory comprising a plurality of the non-volatile memory cell of claim 7;
a processor communicatively coupled to the non-volatile memory;
a battery coupled to the processor; and
a wireless transceiver.

11. A magnetic tunneling junction (MTJ) structure over a substrate, the structure comprising:
a fixed magnetic material layer or stack comprising one or more layers of magnetic material;
a free magnetic material stack further comprising:
 a metal coupling layer between two magnetic material layers, wherein the magnetic material layers each comprise CoFeB, and the metal coupling layer comprises at least molybdenum (Mo);
a layer of dielectric material between the free magnetic material stack and the fixed magnetic material layer or stack, wherein the first dielectric material layer comprises Mg; and
a synthetic antiferromagnet (SAF) structure between a metal electrode and the fixed magnetic material layer or stack.

12. The MTJ structure of claim 11, wherein:
the magnetic material layers have perpendicular magnetic anisotropy; and
the metal coupling layer is in direct contact with each of the two magnetic material layers.

13. The MTJ structure of claim 11, wherein the metal coupling layer is at least predominantly Mo.

14. The MTJ structure of claim 11, wherein the metal coupling layer comprises Mo alloyed with at least one of Ta, W, Nb, V, Hf, or Cr.

15. The MTJ structure of claim 11, wherein the metal coupling layer has a film thickness of 0.1 nm-1 nm.

16. The MTJ structure of claim 1, wherein the metal coupling layer has a film thickness of 0.1 nm-1 nm.

* * * * *